United States Patent [19]
Liu

[11] Patent Number: 5,850,359
[45] Date of Patent: Dec. 15, 1998

[54] ASYNCHRONOUS HIGH SPEED ZERO DC-CURRENT SRAM SYSTEM

[75] Inventor: Pin-Wu Liu, Saratoga, Calif.

[73] Assignee: V.L.S.I. Technology, Inc., San Jose, Calif.

[21] Appl. No.: 740,379

[22] Filed: Oct. 29, 1996

[51] Int. Cl.[6] ................................................ G11C 11/00
[52] U.S. Cl. .......................... 365/156; 365/154; 365/205; 365/207
[58] Field of Search .................................. 365/156, 154, 365/205, 207, 189.06

[56] References Cited

U.S. PATENT DOCUMENTS

| | | | |
|---|---|---|---|
| 5,034,923 | 7/1991 | Kuo et al. | 365/154 X |
| 5,047,979 | 9/1991 | Leung | 365/154 |
| 5,541,874 | 7/1996 | O'Connor | 365/156 |
| 5,657,290 | 8/1997 | Churcher | 365/156 |

*Primary Examiner*—Huan Hoang
*Attorney, Agent, or Firm*—Flehr Hohbach Test Albritton & Herbert LLP

[57] ABSTRACT

Bit lines coupled to a column of SRAM core cells in an array are sensed asynchronously using zero DC power with either differential sense amplifiers or single-ended amplifiers, according to the present invention. The differential sense amplifier embodiment includes a pair of cross-coupled series-connected PMOS and NMOS transistors connected between the power supplies. Each bit line is coupled to an NMOS gate in the transistor pair, and each PMOS gate is coupled to the drain-source connection of the other series-connected PMOS-NMOS pair. The PMOS gates and PMOS-NMOS drain-source connections define the sense amplifier complementary output signals, whose states are determined by the bit line states. The single-ended embodiment is implemented as a PMOS-NMOS transistor pair inverter connected between the power supplies. Each inverter input is coupled to a bit line, and the inverter outputs are the sense amplifier outputs. In both embodiments, series-connected PMOS-NMOS pairs do not provide any DC path and function asynchronously without clock or enabling signals other than the bit line signals. In either embodiment, a zero DC power consumption bit-line clamp implemented as a PMOS-NMOS inverter is also coupled to each bit line, and is controlled by the associated sense amplifier output signal. The bit-line clamp forces an associated bit line to a full "1" or "0" logic state.

14 Claims, 5 Drawing Sheets

ASYNCHRONOUS HIGH SPEED ZERO DC-CURRENT SRAM SYSTEM

FIELD OF THE INVENTION

The invention relates to static random access memory ("SRAM") systems in general, and more specifically to high speed SRAM systems that can operate asychronously without consuming DC power.

BACKGROUND OF THE INVENTION

SRAM systems are commonly used to store digital information in a computer system. Such memory systems are static in that information is stored in a plurality of latch-type core cells, without a need to dynamically refresh a store charge (as is the case for dynamic random access memory systems). Because there is no refresh cycle, SRAMs are relatively fast, with access times in the 5 ns to 10 ns range, or less.

As equipment and consumer devices become more sophisticated, there is a growing need for block-like units of SRAM systems, preferably provided as application specific integrated circuits ("ASIC"). Ideally, such SRAM systems would operate at high speed, consume zero DC power, operate asynchronously with respect to system clock signal (s), and could be fabricated in relatively small IC chip area, preferably using 0.35 $\mu$m fabrication technology. Unfortunately, as will now be described, these goals are not met by prior art approaches.

FIG. 1 depicts conventional SRAM architecture system 2 that typically is fabricated on one or more IC chips. Generally system 2 includes several blocks of SRAM storage units, e.g., elements 4, 6, 8, 10, wherein each block includes a plurality of latch-type memory cells. A typical block may contain perhaps 32 core cells, and fewer or more than four blocks may be present. The individual core memory cells comprising each block are arrayed in addressable rows and columns, for example, 128 rows and 256 columns. Thus, for the configuration of FIG. 1, where four blocks are present, each block could contain 32 rows and 256 columns of cells.

To address a given memory cell within a block, system 2 provides row and block decoder logic 12 (for decoding a desired row address and block), and also provides column decoder logic 14 (for decoding a desired column address). Control logic 16 receives various control signals such as chip enable ($\overline{CE}$), write enable ($\overline{WE}$) and output enable ($\overline{OE}$), which signals are coupled to the memory array blocks, e.g., 4, 6, 8, 10. These memory blocks also receive a block select (BK) signal and a word line select (WL) signal from row and block decoder 12.

Data to be written or stored within one or more memory cells are received by an input buffer 18, and then passed onto the desired memory cells within the blocks of memory via a write bit line. Reading information from a desired memory cell is accomplished by addressing that cell's row and column, and by coupling the cell to a sense amplifier 20. Sense amplifier 20 differentially compares sense amplifier input signal $SA_{IN}$ and its complement with a threshold voltage level intermediate to a logical "0" and "1".

By comparing the polarity of the differential input signals, sense amplifier senses whether a "1" or a "0" is stored within the addressed cell and couples the appropriate "1" or "0" logic level to output buffer 22. Typically the differential between these input signals is small, perhaps 100 mV or 100 $\mu$A and it can take a relatively long time for sense amplifier 20 to compare the two complementary sense amplifier input signals before deciding whether to output a "0" or a "1" signal to output buffer 22. Buffer 22 is capable of a rapid slew rate, and outputs a data signal corresponding to the sensed "0" or "1" signal to an I/O bus, or other load.

FIG. 2 depicts several SRAM core memory cells 30, 32, 34, 36, which are elements of the memory array blocks shown in FIG. 1, coupled to a sense amplifier 20. In FIG. 2, the various core memory cells form an array having (m+1) horizontal rows and (n+1) vertical columns.

Each SRAM core cell preferably comprises six complementary metal oxide semiconductor ("CMOS") transistors. Transistors M1 and M2 function as pass (or switch) transistors, while transistors M3, M4, M5, and M6 form a pair of cross-coupled inverters configured as a memory latch cell. In each core cell, gate leads from pass transistors M1, M2 are coupled to a "horizontal" word row lines such as $WL_0$, while M1, M2 source leads are coupled to "vertical" complementary bit load lines such as $B_0$ and $\overline{B_0}$. The various core cells may be "vertically" coupled to an active load via column pass load transistors, e.g., M10, M12, and to the complementary inputs of sense amplifier 20 via sense pass transistors, e.g., M11, M13. As described below, transistors M10, M12 provide an active bit line load function when reading data stored in a core cell in the column associated with the relevant pair of load transistors.

Whether data is to be read into or out of a given core cell is determined by the logical state of signals from decoder 12 and control logic 16, coupled to that cell. For example, writing data to cell involves placing the data and its complement on the complementary bit lines in the column containing the cell. The row word line signal (e.g., $WL_0$) for the horizontal row containing the desired cell is then asserted, e.g., made "1", thus selecting the row. All unselected rows including all rows in unselected memory unit blocks will have unasserted or "0" row word line signals.

To read a given cell involves coupling the sense amplifier inputs to the complementary bit lines coupled to the column containing the cell. Commonly the bit lines are first precharged, and the relevant row word line signal is asserted. The logic level of either the bit line or its complement will be discharged by a pair of relevant pull down transistors, and the complementary signals are coupled via pass transistors, e.g., M11, M13, to the differential inputs of sense amplifier 20.

The configuration of FIG. 2 has several disadvantages in read mode. For example, a DC path is present between the upper power supply (e.g., to which the drains of M10 or M12 are coupled) and the lower power supply (here, ground) via M10, M1, M4, or M12, M2, M6 and the sense amplifier 20. As a result, the bit lines coupled to the desired core cell consume DC power, as does the sense amplifier. Clearly, this non-zero quiescent DC consumption wastes operating power. Further, the need to dissipate quiescent power means the dimensions of the associated conductive traces will be larger than if zero DC consumption could somehow be attained. As a result, either fewer components can be fabricated on a given IC chip area, or the chip area must be increased. Further, sense amplifier 20 frequently consumes too much DC power. (It is to be understood that as used herein, the source and drain leads on a MOS switching transistor are interchangeable; the device has an input gate lead and two output leads, either of which may be called the source or the drain).

FIG. 3 depicts a portion of a prior art SRAM system in which a precharge equalization unit 40 helps reduce the time in which a sense amplifier 20 recognizes the "0" or "1" state of the signal stored in a core cell 30 in a read operation. Assume for example that on the last read cycle, core cell 30 was read, and that $B_0$ was a logical "0", and that on the present read cycle, the same core cell 30 is to be read, and that $B_0$ is now a "1".

Precharge equalization unit 40 includes two pull-up transistors M14, M15 that in a precharge mode (determined by the signal of a precharge clock CLK) pull the complementary bit lines up to a known predetermined intermediate threshold voltage, irrespective of whatever potential is presently on the bit line. At the same time, transistor M16 turns on, shorting together the two complementary bit lines, and equalizing their respective potentials. Thus, in the present example where $B_0$ was a "0" on the last read cycle and now is "1", $B_0$ and its complement $\overline{B_0}$ will both be actively forced to a common intermediate voltage threshold.

After a pre-charge cycle, sense amplifier 20 is enabled during a read cycle, for example by an "SA" control clock signal. An equalization unit 42 comprising parallel-coupled CMOS transistors shorts together, or equalizes, the complementary sense amplifier output signals upon receive of an appropriate signal, here "BAL" and its complement.

Although the configuration of FIG. 3 may rapidly output an accurate read signal as reliably as the configuration of FIG. 2, it is necessary to providing circuitry to generate the various required clock timing signals, e.g., CLK, SA, BAL. It is known in the art to manufacture such block timing signals using so-called address transition detection ("ATD") techniques. Alternatively, an external clock is provided in a synchronous operation mode. Nonetheless, the need to provide such clocking signals adds manufacturing expense and reduces IC chip area required for the SRAM system per se.

What is needed is an SRAM system that can be fabricated in a small IC chip area, that consumes no DC power, and that can operate at high speed asynchronously.

The present invention provides such a memory system, and a method of implementing the same.

SUMMARY OF THE PRESENT INVENTION

The present invention, which may be used with an array of conventional SRAM core cells, provides an asynchronous sense amplifier that is coupled between the complementary bit lines in a column containing a core cell to be read. The sense amplifier consumes zero DC power, may be fabricated in a small IC chip area, and operates asynchronously. A zero DC power consumption bit-line clamp preferably is also coupled to each bit line, and is controlled by the associated sense amplifier output signal. The bit-line clamp forces an associated bit line to a full "1" or "0" logic state.

In a first embodiment, a differential sense amplifier is provided for each column of core cells in an array. This sense amplifier includes a pair of cross-coupled series-connected PMOS and NMOS transistors (or other complementary active devices) connected between the upper and lower power supplies. Each bit line is coupled to an NMOS gate. Each PMOS gate is coupled to the drain-source connection of the other series-connected PMOS-NMOS pair. The PMOS gates and PMOS-NMOS drain-source connections define the sense amplifier complementary output signals. The series-connected PMOS-NMOS pairs do not provide any DC path, and thus no DC power is consumed by the sense amplifier. As a result, the sense amplifier can operate continuously and does not require clock signals to be enabled.

In this embodiment, a bit line clamp is also coupled to each complementary bit line. Each bit line clamp includes a series-connected PMOS-NMOS transistor pair, configured as an inverter. Within each clamp transistor pair, the PMOS-NMOS source-drain connection is coupled to a bit line (and thus to the gate of an associated NMOS transistor in the sense amplifier). Further, the gates of each PMOS-NMOS clamp pair are coupled together and to the source-drain connection of an associated sense amplifier PMOS-NMOS pair. As such, the bit line clamps are controlled by the sense amplifier output signals, and clamp the potential of an associated bit line to a full "1" or "0" logic level. No DC power is consumed by the clamp transistors.

In a second embodiment, a pair of single-ended sense amplifiers is provided for each column of core cells in the array. Each single-ended sense amplifier comprises an inverter implemented as a series-connected PMOS-NMOS transistor string, connected between the upper and lower power supplies. The PMOS-NMOS gates are coupled together to an associated bit line, and the drain-source output connection defines the single-ended sense amplifier output. Because the PMOS and NMOS transistors are series-coupled, no DC path is provided, and thus no quiescent DC power is consumed. As a result, the sense amplifiers require no clock signals to be enabled.

Similarly to the first embodiment, a bit line clamp (as above-described) preferably is also coupled to each complementary bit line. As described, the bit line clamps are controlled by the sense amplifier output signals.

In either embodiment, a parallel-coupled PMOS-NMOS pass gate preferably is coupled between either complementary output from a sense amplifier and the input to a common latch cell. The gate leads of the pass gate are coupled to complementary column select signals, which result in the output from a single sense amplifier being input to the common latch cell. The latch cell output may then be coupled to an output buffer in normal fashion.

Other features and advantages of the invention will appear from the following description in which the preferred embodiments have been set forth in detail, in conjunction with the accompanying drawings.

DETAILED DESCRIPTION OF THE PREFERRED EMBODIMENTS

Figure 4:
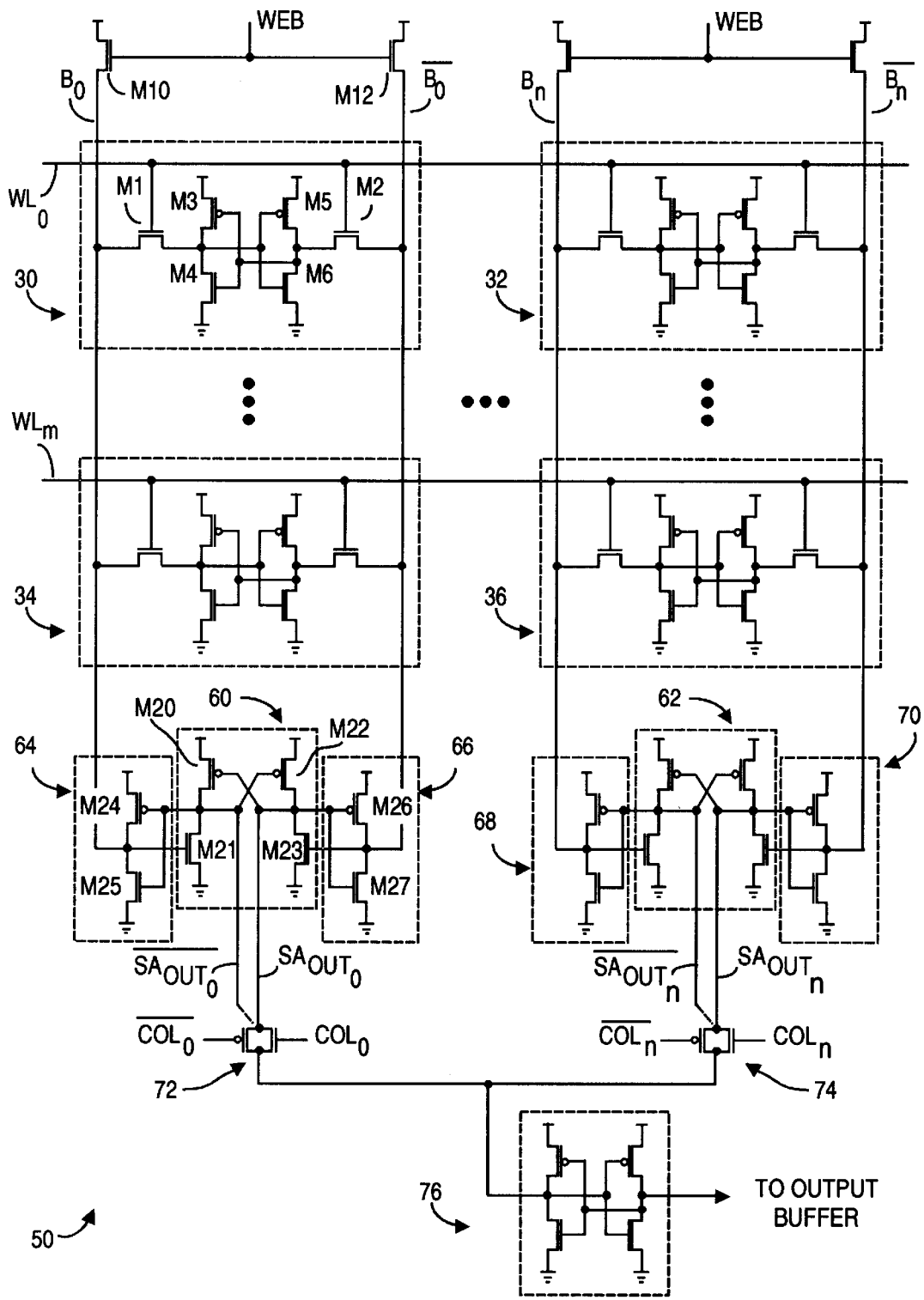
FIG. 4 depicts a cross-coupled sense amplifier and bit line clamps, according to a first embodiment of the present invention.

FIG. 4 depicts a first embodiment of the present invention, in which an SRAM memory system 50 includes a cross-coupled sense amplifier, e.g., 60, 62 coupled between the complementary bit lines associated with each column of memory core cells. The core cells, e.g., 30, 32, may be conventional six transistor cells, as earlier described. As shown in FIG. 4, the present invention preferably provides a bit line clamp, e.g., 64, 66, 68, 70, associated with each bit line in the array. The clamps respond to the sense amplifier output signals, and force the bit line potentials to a full "1" or "0" logic state. If desired, part or all of system 50 may be fabricated on a single IC chip.

Sense amplifier 60 (as well as the other sense amplifiers in the array, e.g., sense amplifier 62) preferably comprises a first pair of series-coupled PMOS and NMOS transistors (respectively M20, M21) cross-coupled to a second pair of series-coupled PMOS and NMOS transistors (respectively M22, M23). Each pair of PMOS and NMOS transistors is coupled between the upper power supply and lower power supply, here shown as ground.

The first and second pairs of PMOS-NMOS transistors are cross-coupled in that the gate of the PMOS transistor in one pair is coupled to the PMOS source-NMOS drain connection of the other pair. (This source-drain connection defines what may be termed an interconnection node). The bit line inputs to sense amplifier 60 are coupled to the gate of one of the NMOS transistors in an associated PMOS-NMOS pair. Thus, bit line $B_0$ is connected to the gate lead of NMOS transistor M21, in which the first PMOS-NMOS transistor pair (M20, M21) is said to be associated with bit line $B_0$. In similar fashion, the second PMOS-NMOS transistor pair (M22, M23) is associated with the complementary bit line $\overline{B_0}$, which bit line is connected to the gate of NMOS transistor M23.

It is readily seen that sense amplifier 60 draws essentially zero DC quiescent power. By essentially zero DC quiescent power it is meant that while unavoidable and preferably minuscule leakage currents may exist, the magnitude of such currents will be less than perhaps 1 Na. By contrast, sense amplifiers that consume DC power can draw many mA of current. In a memory system containing hundreds of sense amplifiers, the difference in power consumption can be very substantial.

Consider the case where $B_0$ is "1" and $\overline{B_0}$ is "0". The gate of NMOS transistor M21 sees $B_0$="1", and turns on, which pulls the drain-source junction in the first transistor pair M20, M21 down to "0", which means $\overline{SA}$="0". The $\overline{B_0}$="0" signal coupled to the gate of NMOS transistor M23 turns M23 off, while at the same time PMOS transistor M26 is turned on by the "0" signal coupled to its gate from turned-on NMOS transistor M21. As a result, the drain-source connection of the second PMOS-NMOS transistor pair M22, M23 is "1" (e.g., $\overline{SA_{OUT0}}$="1"), which "1" turns off PMOS transistor M20.

Thus, in each clamp transistor pair, although one of the transistors is on, the other series-connected transistor is off. As a result, there is no path between the upper and lower power supplies to conduct quiescent or DC current. It will be appreciated that the sense amplifier configuration is symmetrical, and that no DC path would exist if the "1" and "0" states of the complementary bit lines were instead "0" and "1".

Figure 2:
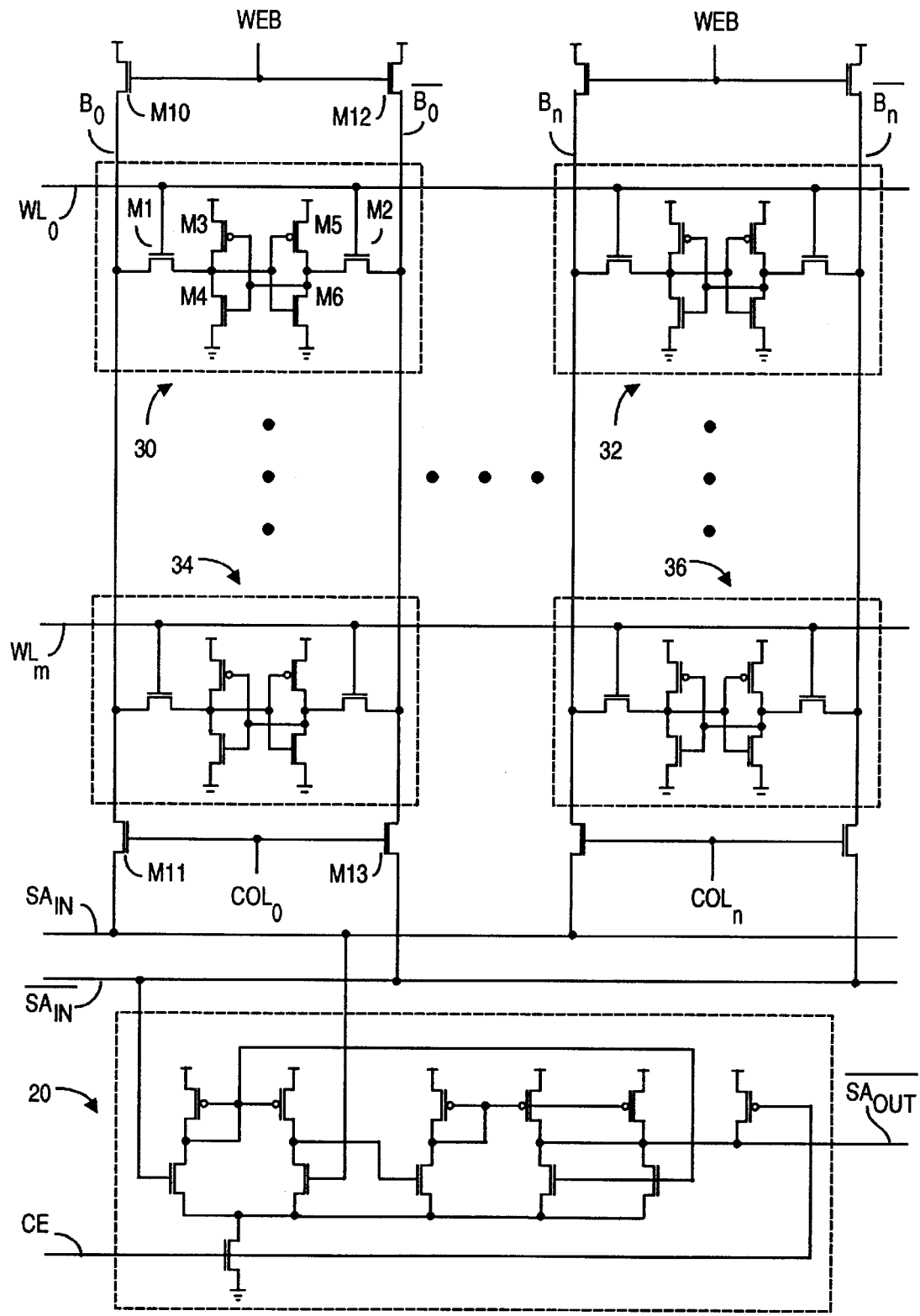
FIG. 2 is a simplified schematic depicting implementation of SRAM memory array blocks and a sense amplifier, according to the prior art.
Figure 3:
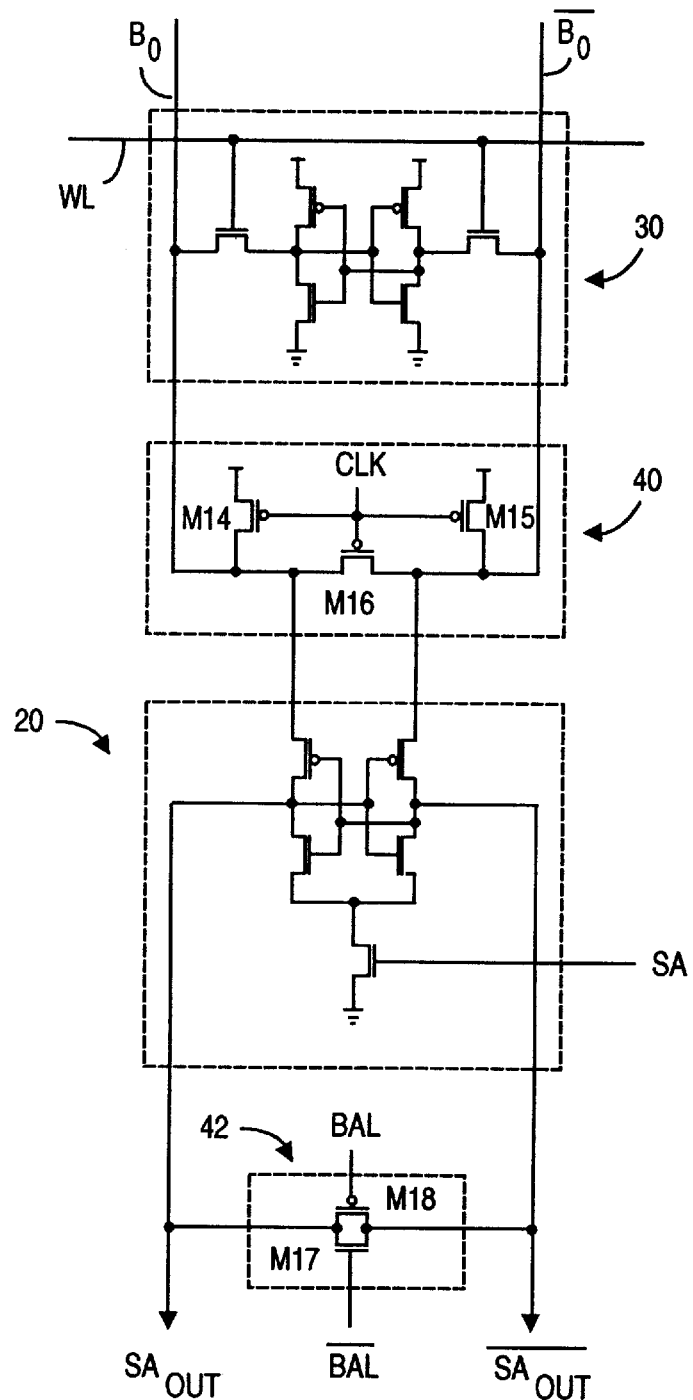
FIG. 3 is a simplified schematic depicting implementation of an SRAM memory system in which the sense amplifier uses pre-charging and equalization, according to the prior art.

Because no DC power is consumed, the sense amplifier may remain operational all of the time. Stated differently, there is no need to save operating power by only enabling the sense amplifier at chosen times, using for example enabling clock signals such as signal CE in FIG. 2, or signal $\overline{SA_{OUT0}}$ in FIG. 3. As a result, applicant's sense amplifier operates asynchronously, and thus eliminates the need to generate sense amplifier enabling or timing clock signals.

Because applicant's cross-coupled sense amplifiers do not consume DC power, they may be fabricated with very small geometry MOS transistors, e.g., 0.35 $\mu$m gate widths. The ability to produce a smaller sized sense amplifier reduces area on the IC chip containing the sense amplifier (and perhaps all of system 50). Further, IC chip area is also conserved by not having to generate any sense amplifier enabling and timing signals. It will be further appreciated that smaller sense amplifier transistor geometry can reduce associated capacitance, and can advantageously reduce switching times.

As shown in FIG. 4, a bit line clamp, e.g., 64, 66, 68, 70, preferably is also coupled to each bit line in the array. Clamp 64 comprises series-coupled PMOS-NMOS transistor pair M24, M25, which are configured as an inverter and are associated with bit line $B_0$. Similarly, clamp 66 comprises PMOS-NMOS transistor pair M26, M27, configured as an inverter and associated with the complementary bit line $\overline{B_0}$. Each of the clamp transistor pairs is series-connected between the upper and lower power supplies.

The gate leads of the PMOS and NMOS transistors in each clamp pair are connected together and define the clamp input node. Each clamp input node is coupled to the sense amplifier output signal representing the unassociated bit line. Thus, the gate leads of transistors M24, M25 in clamp 64 are coupled to the $\overline{SA_{OUT0}}$ sense amplifier output signal associated with bit line $\overline{B_0}$. In each clamp transistor pair, the PMOS source and NMOS drain are connected together and to the associated bit line. Thus, bit line $B_0$ is coupled to the drain-source common connection of transistors M24, M25 in clamp 64.

Assuming again that $B_0$="1", it was seen above that $\overline{SA}$="0", which "0" is coupled to the tied-together gates of M24–M25 in clamp 64. Within clamp 64, this "0" level gate signal turns clamp transistor M25 off, and M24 on. The on state of M24 pulls the $B_0$ bit line all the way to a full logic "1" level, perhaps +3.3 VDC, whereas before clamping it may have been only at perhaps +2.0 VDC. Within clamp 66, $\overline{B_0}$="0", which means SA="1" (as was above described). This "1" signal is coupled to the tied-together gates of transistors M26, M27 in clamp 66, causing transistor M26 to turn off, and transistor M27 to turn on. When M27 turns on, it pulls bit line $\overline{B_0}$ all the way down to a logic "0" state.

It will be appreciated that the clamp transistor pairs consume zero DC power because if the PMOS transistor is on, the series-coupled NMOS transistor is off, and vice versa. As a result, small geometry clamp transistors may be used, and there is no need to provide clamp clocking or enabling signals.

Referring again to FIG. 4, one of the complementary sense amplifier outputs from each cross-coupled sense amplifier is input to a sense amplifier pass gate, e.g., 72, 74. For example, in array column 0 (which contains core cells 30, 34, among other cells), the output from sense amplifier 60, $SA_{OUT0}$ is input to pass gate 72. However, as shown by the partially dashed line, the complemented sense amplifier output signal could instead be used.

Preferably each pass gate 72, 74 includes a PMOS-NMOS transistor pair, whose drain leads are coupled together, and whose source leads are coupled together. Complementary column select signals are coupled to the gate leads of these transistors. Thus, if core cell 36 in array column n is to be read, sense amplifier 62 will output a sense amplifier signal to pass gate 74, which gate is caused to conduct (or pass) this signal by virtue of the "1", "0" state of the $COL_n$, $\overline{COL_n}$ signals. (By contrast, all other columns in the array will be unselected, and will have "0", "1" state $COL_n$, $\overline{COL_n}$ signals).

Figure 1:
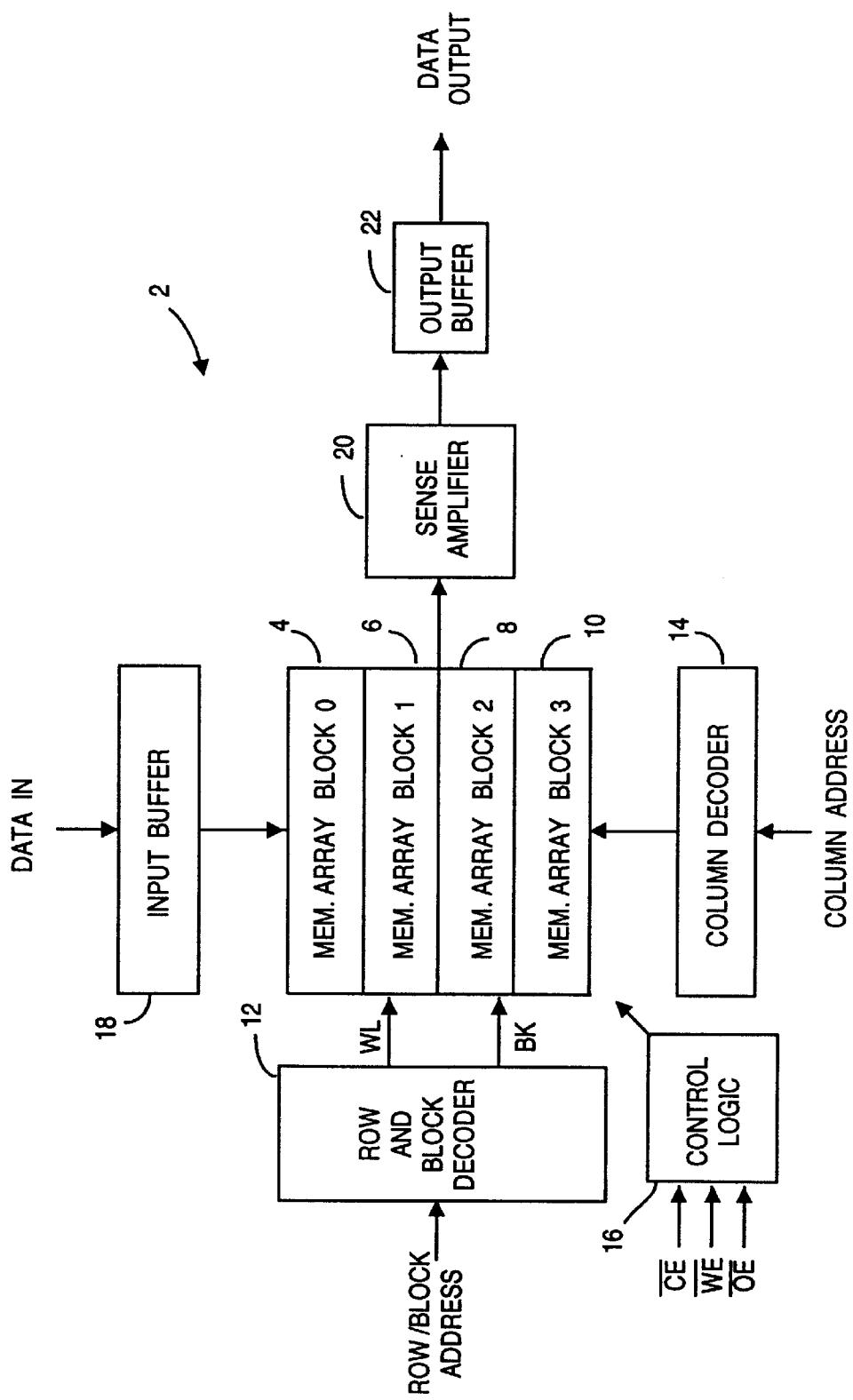
FIG. 1 is a block diagram of conventional SRAM system architecture, according to the prior art.

The selected sense amplifier signal for the desired core cell is then passed to a conventional latch 76 that may be implemented as a pair of cross-coupled inverters. The output from latch 76 may be provided as input to a conventional output buffer, such as output buffer 11 in FIG. 1.

Figure 5:
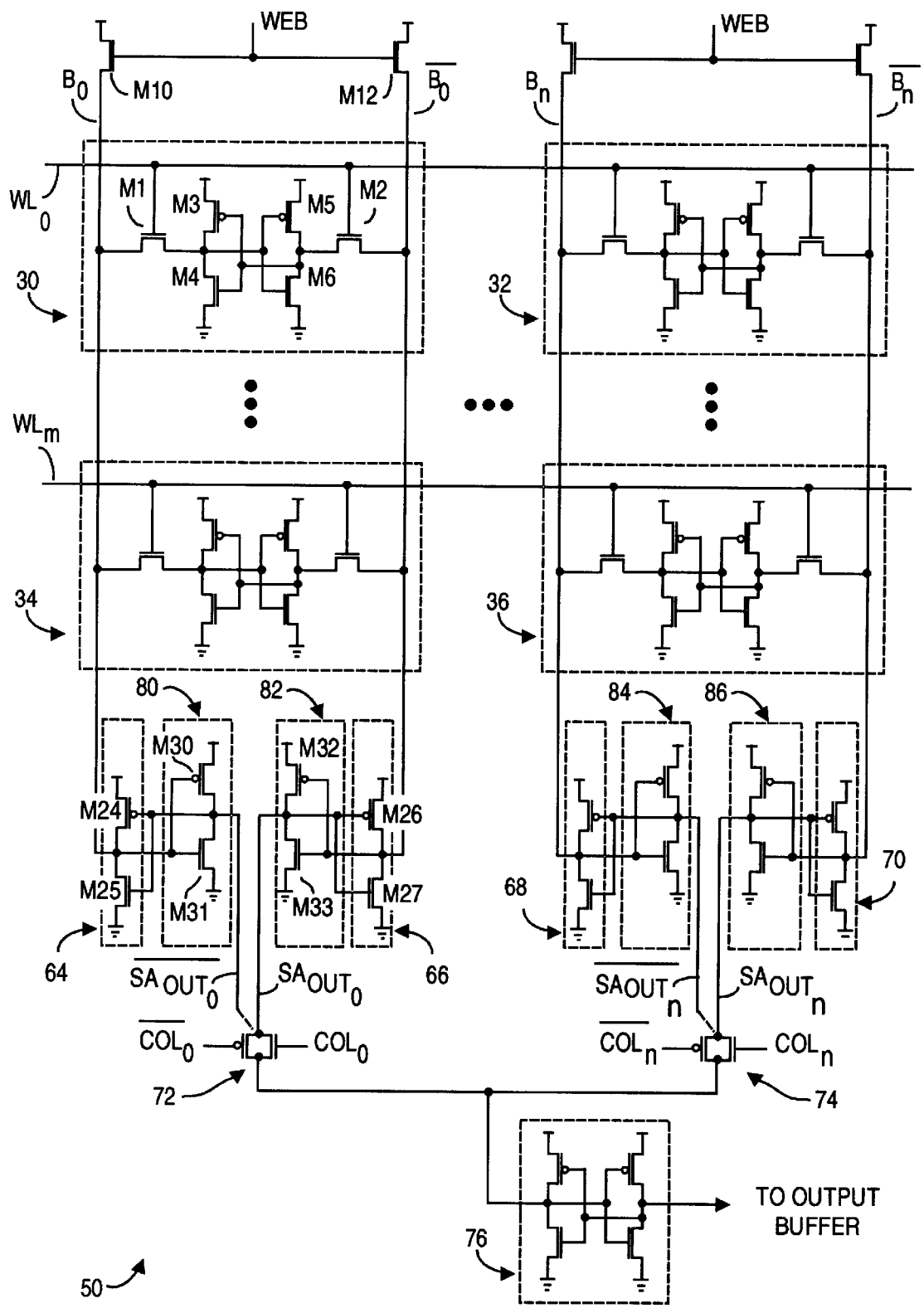
FIG. 5 depicts single-ended sense amplifiers and bit line clamps, according to a second embodiment of the present invention.

FIG. 5 depicts a second embodiment of the present invention, in which an SRAM system 50 includes single-ended sense amplifiers, e.g., 80, 82, 84, 86, one sense amplifier being associated with each bit line. As with the above-described differential cross-coupled embodiment, core cells, e.g., 30, 32, may be conventional six transistor cells, and all or part of system 50 may be fabricated on a single IC.

Sense amplifier 80 is associated with bit line $B_0$, and includes a series-coupled PMOS-NMOS transistor pair, which is connected between the upper and lower power supplies. Similarly, sense amplifier 82 includes series-coupled PMOS-NMOS transistors M32, M33, and is associated with the complementary bit line $\overline{B_0}$. The other sense amplifiers in the array, e.g., sense amplifiers 84, 86 preferably are identical.

Within a sense amplifier transistor pair, the gates are tied together and coupled to the associated bit line.

For example, the gates of M30, M31 are coupled to bit line $B_0$. The PMOS-NMOS drain-source connection defines the sense amplifier output for the associated bit line, and thus M30–M31 output a complementary sense amplifier signal $\overline{SA_{OUT0}}$.

It is readily apparent that each singled-ended sense amplifier conducts no DC power. For example, if bit line $B_0$ is in a "1" state, the gate of NMOS transistor M31 is "1", which turns on M31. At the same time, the gate of PMOS transistor M30 is also "1", which turns M30 off. The M30–M31 source-drain output signal ($\overline{SA_{OUT0}}$) is thus pulled to the lower power supply, here "0", by the turned-on transistor M31. Although M31 is on, M30 is off, and no DC path between the upper and lower power supplies exists. It will be appreciated that when $B_0$="0", M31 is turned off, M30 is turned on, and the $\overline{SA_{OUT0}}$ output signal is pulled up to the upper power supply (e.g., to "1") by the turned-on transistor M30. Again, no DC path is presented.

Single-ended sense amplifier 82 operates similarly, and will output a signal that is complementary to the logic state output by sense amplifier 80. Similar to what was described with respect to the first embodiment, because no DC power is dissipated, the sense amplifier transistors, e.g., M30, M31, M32, M33, may be small geometry devices that require little IC chip area, and can switch states rapidly. It will also be appreciated that applicant's single-ended sense amplifiers operate asynchronously in that no sense amplifier enabling or clock signals are required to be generated. Because generators are not required to create such signals, further area is saved on the IC chip containing all or part of system 50.

Preferably this single-ended embodiment also includes bit clamps, e.g., 64, 66, 68, 70, whose configuration and operation may be identical to what was described above with respect to FIG. 5. Further, the embodiment of FIG. 5 preferably also couples one of the single-ended sense amplifier outputs associated with each column in the array to a sense amplifier pass gate, e.g., 72, 74. The implementation of functioning of these pass gates may be identical to what was above described with respect to FIG. 4. The column-selected sense amplifier output signal is coupled to a convention latch 76, whose output may be coupled to a conventional output buffer, such as buffer 22 in FIG. 1.

Preferably all or part of systems 50, as shown in FIGS. 4 and 5, are implemented as application-specific integrated circuits ("ASICs") on a single IC. Such ASICs may find use in a variety of applications, including by way of example a scratch pad RAM compiler. The resultant ASICs will consume zero DC power, may be implemented with the smallest practical transistor geometry (presently 0.35 µm gate length, and likely to be even smaller in the future). Further, such ASICs make efficient use of IC chip area because their operation is asynchronous, and ATD or other sense amplifier generation of clock, enabling, or timing generation is eliminated.

Although the preferred embodiments have been described with respect to CMOS implementation, it will be appreciated that other switching devices may in fact be used, including non-MOS complementary active devices.

Modifications and variations may be made to the disclosed embodiments without departing from the subject and spirit of the invention as defined by the following claims.

What is claimed is:

1. A method of asynchronously sensing the state stored in a core cell coupled between a bit line and a complementary bit line in a column in a memory array, the method comprising the following steps:
   (a) providing a first inverter having an input node coupled to said bit line and having an output node that outputs a complement of said state stored in said core cell; and
   (b) clamping a signal at said output node of said first inverter unit to a binary logic state;
   wherein said first inverter unit operates asynchronously and consumes substantially zero DC power.

2. The method of claim 1, wherein:
   step (b) includes providing a second inverter having an input node coupled to said output node of said first inverter, and having an output node coupled to said input node of said first inverter.

3. The method of claim 1, wherein:
   said memory array includes an array of static random access memory (SRAM) core cells.

4. The method of claim 1, wherein:
   step (a) includes providing said first inverter unit implemented with a PMOS transistor coupled in series with an NMOS transistor.

5. The method of claim 1, wherein said first inverter unit consumes less than about 1 nA DC.

6. An asynchronously operable substantially zero DC power consuming single-ended sense amplifier useable with a system that includes an array of addressable memory core cells that are coupled between a bit line and a complementary bit line in a column in said memory array, comprising:
   a first inverter unit having an input node coupled to said bit line, and having an output node that outputs a signal representing a complement of a logic state stored in an addressed one of said core cells; and
   a second inverter unit having an input node coupled to said output node of said first inverter, and having an output node coupled to said input node of said first inverter, said second inverter clamping a signal at said output node of said first inverter unit to a binary logic state;
   wherein said first and said second inverter unit operate asynchronously and consume substantially zero DC power.

7. The sense amplifier of claim 6, wherein at least one of said first inverter unit and said second inverter unit comprises a PMOS transistor coupled in series with an NMOS transistor.

8. The sense amplifier of claim 6, wherein:

said memory array includes an array of static random access memory (SRAM) core cells.

9. The sense amplifier of claim 6, further including a second asynchronously operable substantially zero DC power consuming single-ended sense amplifier comprising:

a third inverter unit having an input node coupled to said complementary bit line, and having an output node that outputs a signal representing said logic state stored in an addressed one of said core cells; and a fourth inverter unit having an input node coupled to said output node of said third inverter, and having an output node coupled to said input node of said third inverter, said fourth inverter clamping a signal at said output node of said first inverter unit to a binary logic state;

wherein said third and said fourth inverter unit operate asynchronously and consume substantially zero DC power.

10. The sense amplifier of claim 6, wherein said sense amplifier consumes less than about 1 nA DC.

11. An integrated circuit comprising:

an array of addressable static random access memory core cells including core cells coupled to a bit line and a complementary bit line in a column in said array; and an asynchronously operable substantially zero DC power consuming single-ended sense amplifier comprising:

a first inverter unit having an input node coupled to said bit line, and having an output node that outputs a signal representing a complement of a logic state stored in an addressed one of said core cells; and a second inverter unit having an input node coupled to said output node of said first inverter, and having an output node coupled to said input node of said first inverter, said second inverter clamping a signal at said output node of said first inverter unit to a binary logic state;

wherein said first and said second inverter unit operate asynchronously and consume substantially zero DC power.

12. The integrated circuit of claim 11, wherein at least one of said first inverter unit and said second inverter unit comprises a PMOS transistor coupled in series with an NMOS transistor.

13. The integrated circuit of claim 11, further including:

a second asynchronously operable substantially zero DC power consuming single-ended sense amplifier comprising:

a third inverter unit having an input node coupled to said complementary bit line, and having an output node that outputs a signal representing said logic state stored in an addressed one of said core cells; and a fourth inverter unit having an input node coupled to said output node of said third inverter, and having an output node coupled to said input node of said third inverter, said fourth inverter clamping a signal at said output node of said first inverter unit to a binary logic state;

wherein said third and said fourth inverter unit operate asynchronously and consume substantially zero DC power.

14. The integrated circuit of claim 11, wherein said sense amplifier consumes less than about 1 nA DC.

* * * * *

UNITED STATES PATENT AND TRADEMARK OFFICE
CERTIFICATE OF CORRECTION

| | | |
|---|---|---|
| PATENT NO. | : | 5,850,359 |
| DATED | : | December 15, 1998 |
| INVENTOR(S) | : | LIU |

It is certified that error appears in the above-indentified patent and that said Letters Patent is hereby corrected as shown below:

Column 5, line 44, delete "M26" and insert therefor --M22--.

Signed and Sealed this

Thirteenth Day of July, 1999

*Attest:*

Q. TODD DICKINSON

*Attesting Officer*   Acting Commissioner of Patents and Trademarks